US011375621B2

(12) United States Patent
Plano et al.

(10) Patent No.: US 11,375,621 B2
(45) Date of Patent: Jun. 28, 2022

(54) FRAME ASSEMBLY FOR SURFACE MOUNT TECHNOLOGY STENCIL

(71) Applicant: Blue Ring Stencils, LLC, Fort Collins, CO (US)

(72) Inventors: William Edward Plano, Graford, TX (US); Richard McGhee Kight, Stone Mountain, GA (US); Fraser Murray Shaw, Troon (GB); Frederick William Cox, Lumberton, NJ (US)

(73) Assignee: Blue Ring Stencils, LLC, Fort Collins, CO (US)

( * ) Notice: Subject to any disclaimer, the term of this patent is extended or adjusted under 35 U.S.C. 154(b) by 0 days.

(21) Appl. No.: 17/090,337

(22) Filed: Nov. 5, 2020

(65) Prior Publication Data

US 2021/0136924 A1 May 6, 2021

Related U.S. Application Data

(60) Provisional application No. 62/930,698, filed on Nov. 5, 2019.

(51) Int. Cl.
*H05K 3/30* (2006.01)
*B29C 65/20* (2006.01)
(Continued)

(52) U.S. Cl.
CPC ............. *H05K 3/303* (2013.01); *B29C 65/20* (2013.01); *B29C 66/12421* (2013.01);
(Continued)

(58) Field of Classification Search
CPC ... B05C 17/06; B05C 17/08; B29C 66/12421; H05K 3/1225; H05K 2203/01; B41F 15/34; B41F 15/36
See application file for complete search history.

(56) References Cited

U.S. PATENT DOCUMENTS 3,962,805 A 6/1976 Hamu
5,802,971 A 9/1998 Hamu et al.
(Continued)

FOREIGN PATENT DOCUMENTS

WO 2013110685 A1 8/2013
WO 2015081382 * 12/2014 ............... E06B 3/58

OTHER PUBLICATIONS

Young, Lee; International Search Report and Written Opinion of the International Searching Authority issued in International Application No. PCT/US2020/059081; dated Feb. 2, 2021; 9 pages.

*Primary Examiner* — Matthew G Marini
*Assistant Examiner* — Marissa Ferguson-Samreth
(74) *Attorney, Agent, or Firm* — Ulmer & Berne LLP (57) ABSTRACT

A framed stencil for surface mount technology (SMT) is provided. The frame assembly includes a frame member and a binding insert. The frame member includes an inner perimeter portion and an outer perimeter portion that cooperates with the inner perimeter portion to define an elongated channel. The outer perimeter portion includes a first cantilever portion that extends over the elongated channel and towards the inner perimeter portion. The binding insert is configured for releasable insertion into the elongated channel. The binding insert includes a base and a tongue. The base configured to interface with a mesh substrate to facilitate coupling therebetween. The tongue is coupled to the base and extends substantially horizontally from the base. When the binding insert is inserted into the elongated channel, the tongue extending beneath the first cantilever portion to facilitate retention of the binding insert to the frame member. Methods are also provided.

16 Claims, 10 Drawing Sheets

(51) Int. Cl.
  *B29C 65/00* (2006.01)
  *H05K 3/12* (2006.01)
  *B05C 17/06* (2006.01)
  *B05C 17/08* (2006.01)

(52) U.S. Cl.
  CPC ............ *B29C 66/71* (2013.01); *B29C 66/729* (2013.01); *H05K 3/1225* (2013.01); *B05C 17/06* (2013.01); *B05C 17/08* (2013.01); *H05K 2203/01* (2013.01)

(56) References Cited

U.S. PATENT DOCUMENTS

| | | | |
|---|---|---|---|
| 5,957,048 | A | 9/1999 | Newman, Jr. |
| 6,331,223 | B1 | 12/2001 | Wylie et al. |
| 7,866,261 | B2 | 1/2011 | Newman, Jr. |
| 10,081,211 | B2 * | 9/2018 | Hall .................... H05K 3/1225 |
| 2010/0276091 | A1 | 11/2010 | Niswonger |
| 2012/0285637 | A1 | 11/2012 | Kasayu |
| 2015/0130131 | A1 * | 5/2015 | Castillo ................. A63F 3/0635 |
| | | | 273/148 R |
| 2015/0165757 | A1 * | 6/2015 | Erdmann ................ B41F 15/36 |
| | | | 101/127 |
| 2020/0180300 | A1 * | 6/2020 | Bennett .................. B41L 13/02 |

\* cited by examiner

FRAME ASSEMBLY FOR SURFACE MOUNT TECHNOLOGY STENCIL

REFERENCE TO RELATED APPLICATION

This application claims priority of U.S. provisional patent application Ser. No. 62/930,698, entitled Frame Assembly for Surface Mount Technology Stencil, filed Nov. 5, 2019, and hereby incorporates this provisional patent application by reference herein in its entirety.

TECHNICAL FIELD

The apparatus described below generally relates to a frame assembly that serves as a basis for a framed stencil for surface mount technology (SMT). In particular, the frame assembly includes a frame and a binding insert that is coupled with the frame to facilitate attachment of a mesh substrate thereto.

BACKGROUND

Conventional framed SMT stencils include a rigid frame, a mesh substrate that is attached to the rigid frame with epoxy, and a foil layer that overlies the mesh substrate and is formed into a mask for stenciling an underling circuit board. In certain circumstances, the epoxy can become brittle over time which can lead to premature failure (e.g., delamination). Once the frame has been used, it is typically too difficult, time consuming, and/or destructive to try and remove the epoxy from the frame in a manner that will allow the frame to be recycled or reused. As a result, these conventional frames are typically discarded after each use, which can be expensive and detrimental to the environment.

BRIEF DESCRIPTION OF THE DRAWINGS

Various embodiments will become better understood with regard to the following description, appended claims and accompanying drawings wherein:

DETAILED DESCRIPTION

Figure 1:
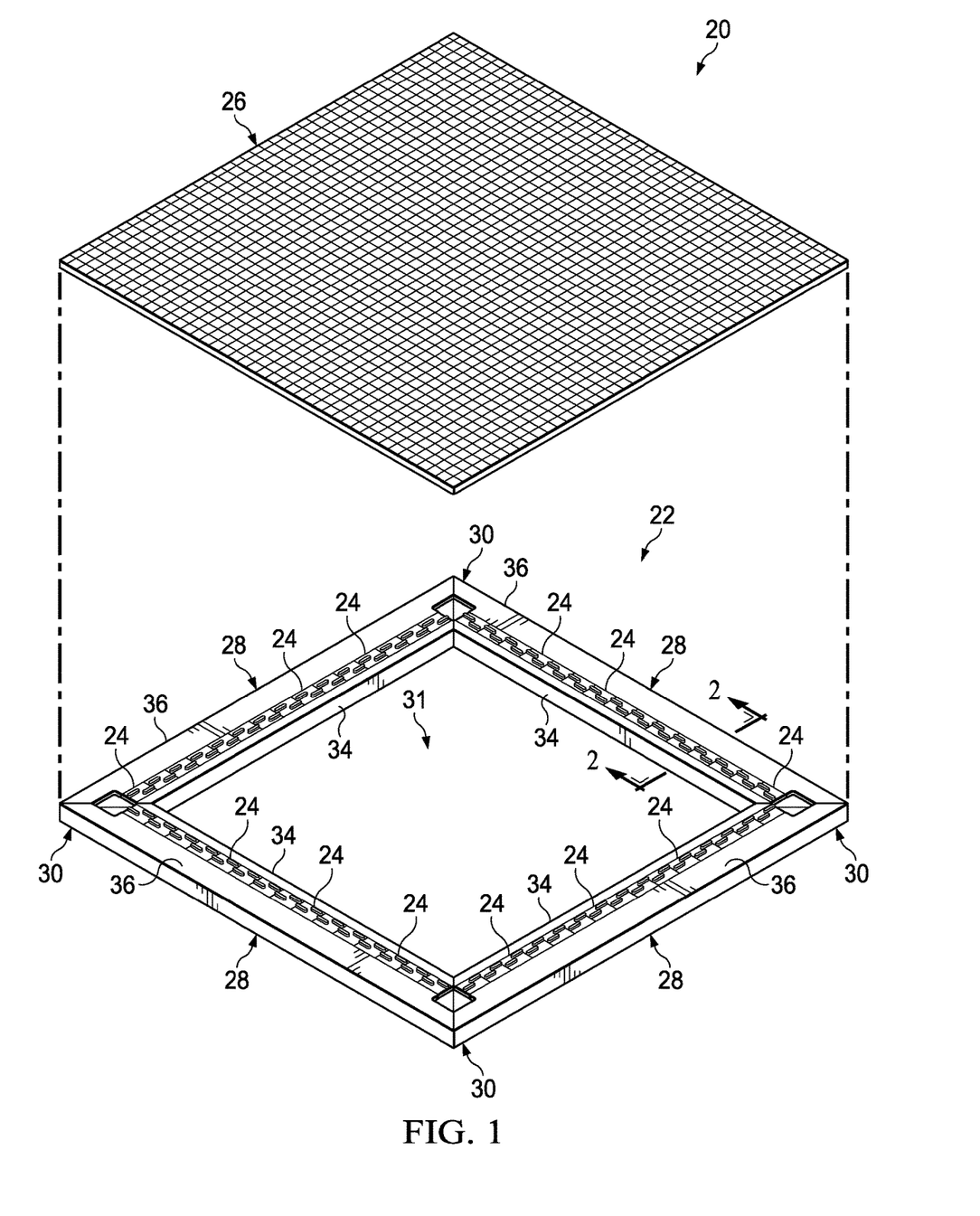
FIG. 1 is an isometric view depicting a frame assembly that includes a frame, a plurality of binding inserts, and a mesh substrate, in accordance with one embodiment.

Embodiments are hereinafter described in detail in connection with the views and examples of FIGS. 1-18, wherein like numbers indicate the same or corresponding elements throughout the views. A frame assembly 20 that serves as a basis for a stencil for applying a solder paste in an SMT process is generally depicted in FIG. 1 and is shown to include a frame 22, a plurality of binding inserts 24 mounted to the frame 22, and a mesh substrate 26 (e.g., a screen) that is secured to the frame 22 by the binding inserts 24. The frame 22 can include a plurality of frame members 28 that are attached together at respective corners 30 and arranged to form a square that defines an opening 31. The binding inserts 24 can be arranged immediately adjacent one another to form a substantially continuous row of binding inserts 24 along each frame member 28. The mesh substrate 26 can include an attached foil (not shown), with holes in the appropriate locations. The mesh substrate 26 can extend over the opening 31 and can cooperate with the opening 31 to define a masking area for the deposition of solder paste therethrough. The mesh substrate 26 can be formed of any of a variety of suitable materials, such as polyester, for example. It is to be appreciated that any quantity of frame members (e.g., two, three or more than four) can be provided to form a frame (e.g., 22) in any of a variety of suitable shapes (e.g., rectangular).

Figure 2:
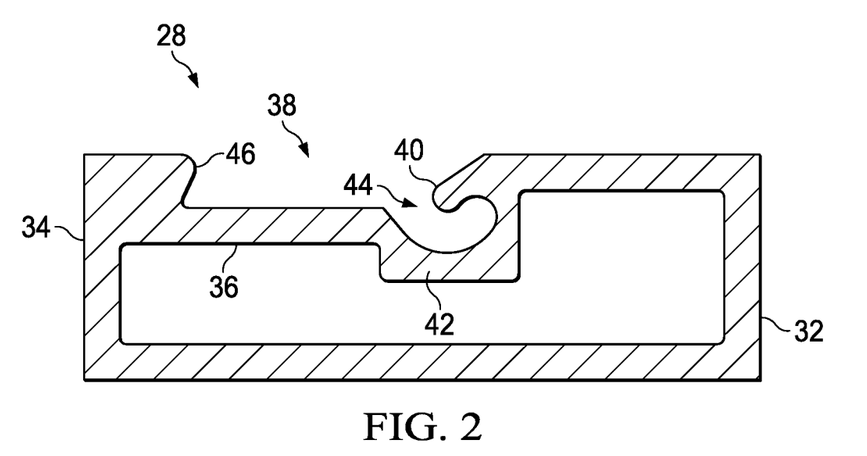
FIG. 2 is a cross-sectional view taken along the line 2-2 in FIG. 1, wherein certain components have been removed for clarity of illustration.

Referring now to FIG. 2, one of the frame members 28 is illustrated as a representative example of each of the frame members 28 illustrated in FIG. 1. The frame member 28 can include an outer perimeter portion 32, an inner perimeter portion 34, and a subfloor 36 that extends between the outer and inner perimeter portions 32, 34. The outer perimeter portion 32, the inner perimeter portion 34, and the subfloor 36 can cooperate to define an elongated channel 38 that extends along substantially the entire length of the frame member 28. In an alternative embodiment, the elongated channel 38 might only extend along a portion of the length of the frame member 28. The outer perimeter portion 32 can include a cantilever portion 40 that extends over the elongated channel 38 and towards the inner perimeter portion 34. The cantilever portion 40 can extend downwardly and can cooperate with a recessed portion 42 of the subfloor 36 to define a pocket 44 therebetween that is part of the elongated channel 38. The pocket 44 can be substantially U-shaped. The inner perimeter portion 34 can include a cantilever portion 46 that extends over the elongated channel 38 and towards the outer perimeter portion 32. The frame members 28 can be formed of metal, such as extruded aluminum or stainless steel, or any of a variety of suitable alternative rigid or semi-rigid materials.

As will be described in further detail below, the binding inserts 24 can engage the frame 22 in such a manner to hold the mesh substrate 26 in place without adhesives (e.g., epoxy) but as effectively as conventional adhesive-type arrangements (e.g., with enough tension to perform properly during a deposition process). However, the binding insert 24 can be pliable enough to allow the binding insert 24 and the mesh substrate 26 to be removed from the frame 22 by simply cutting the mesh substrate 26 and pulling out the binding insert 24 enough to disengage it from the frame 22. The binding insert 24 and the mesh substrate 26 can accordingly be removed from the frame 22 more easily, cost effectively, and quicker, than conventional adhesive-type arrangements that typically require harsh physical processes (e.g., grinding) and/or chemical processes to remove a mesh substrate. The frame 22 can accordingly be more easily recycled than these conventional arrangements.

Figure 3:
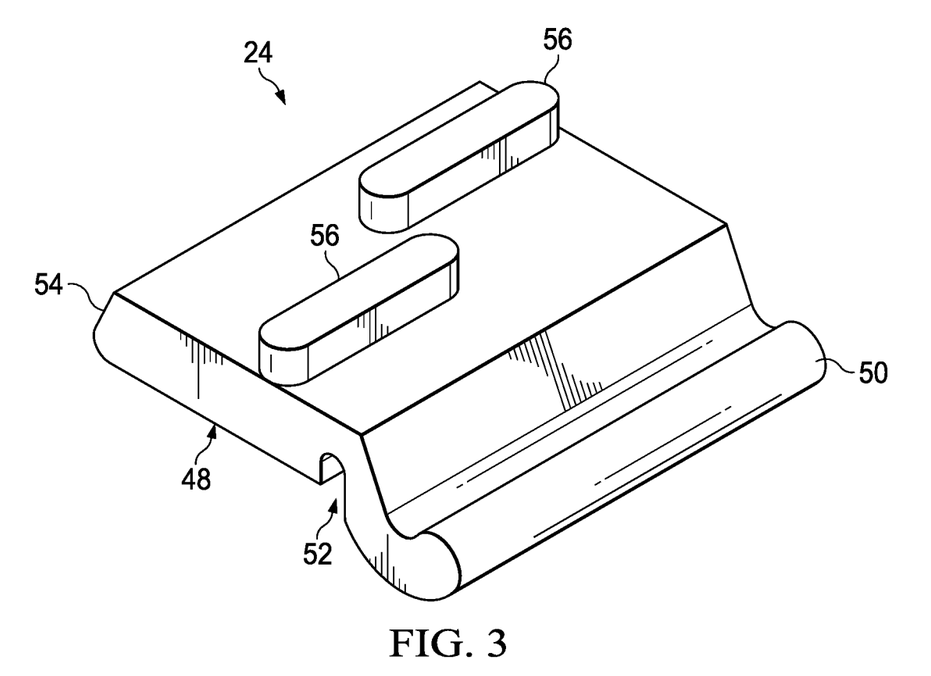
FIG. 3 is an isometric view of one of the binding inserts of FIG. 1.
Figure 4:
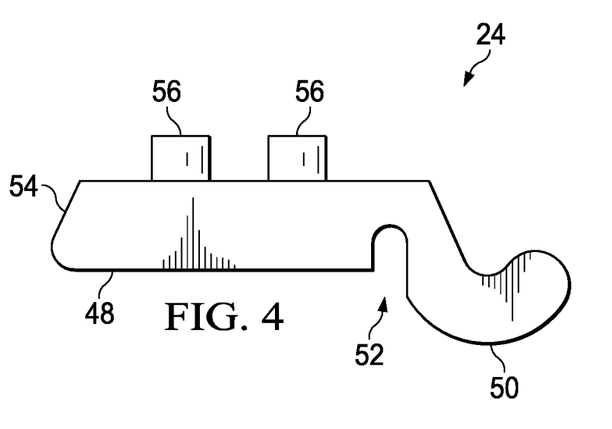
FIG. 4 is a side view of the binding insert of FIG. 3.

Referring now to FIGS. 3 and 4, one of the binding inserts 24 is illustrated as a representative example of each of the binding inserts 24 illustrated in FIG. 1. The binding insert 24 can be configured for releasable insertion into the elongated channel 38. The binding insert 24 can have a cross sectional shape that is substantially similar to the elongated channel 38 to allow the binding inserts 24 to fit at least partially within the elongated channel 38. The binding insert 24 can include a base 48 and a tongue 50 that is coupled with the base 48. The tongue 50 can extend horizontally from the base 48 and can be curved slightly upwardly such that the tongue 50 is substantially J-shaped. The binding insert 24 can define a slot 52 between the base 48 and the tongue 50 that effectively serves as a living hinge to allow the tongue 50 to pivot relative to the base 48. The base 48 can include a chamfered portion 54 on an opposite side of the base 48 as the tongue 50.

The binding insert 24 can include a pair of protrusions 56 that extend upwardly from the base 48 and are offset from one another. The pair of protrusions 56 can interface with the mesh substrate 26 to facilitate coupling therebetween. In one embodiment, the protrusions 56 can be fused into the mesh substrate 26 using heat and pressure, as will be described in further detail below. The binding insert 24 can be formed of a thermoplastic material that is pliable or moldable at certain elevated temperatures but that solidifies upon cooling. The binding insert 24 can be resilient enough to hold the mesh substrate 26 in place and under a stretching force relative to the frame 22 during a deposition process, and yet pliable enough to allow for removal of the binding insert 24 from the frame 22 after the deposition process. In one embodiment, the binding insert 24 can be formed of a polymer. It is to be appreciated that any quantity and/or shape of protrusions can be provided on the base 48. It is also to be appreciated that the mesh substrate 26 can be coupled with base 48 using any of a variety of suitable alternative materials or methods, such as, for example, with adhesive (e.g., epoxy).

Figure 5:
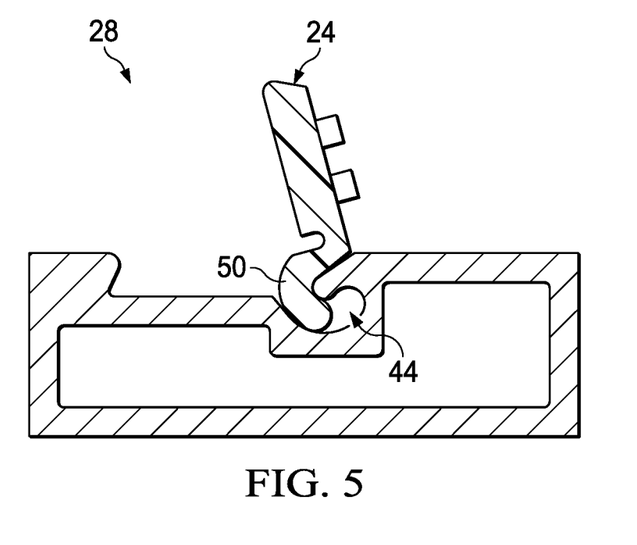
FIGS. 5-7 are different cross-sectional views depicting the progression of the installation of the binding member of FIG. 3 into the frame member of FIG. 2.
Figure 6:
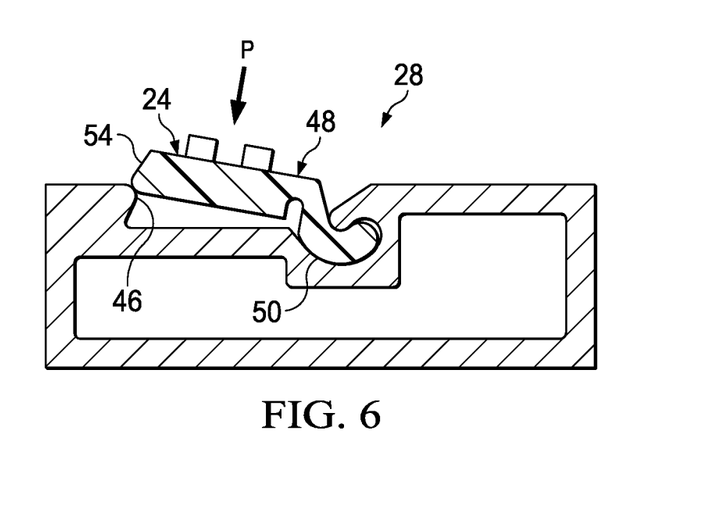
Figure 7:
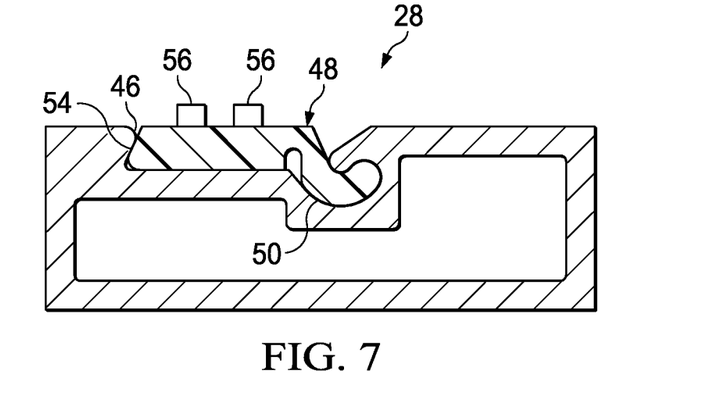

Referring now to FIGS. 5-7, a technique for inserting the binding insert 24 into the elongated channel 38 of one of the frame members 28 will now be described. As illustrated in FIG. 5, the binding insert 24 can initially be provided in a substantially vertical position with the tongue 50 partially inserted into the pocket 44. The binding insert 24 can then be pivoted about the cantilever portion 40 of the outer perimeter portion 32 and into a partially installed position illustrated in FIG. 6, which can cause the tongue 50 to extend further into the pocket 44 and the chamfered portion 54 to be moved into contact with the cantilever portion 46 of the inner perimeter portion 34. Once the binding insert 24 has reached the partially installed position, downward pressure P can be applied to the base 48 (e.g., with a user's finger) to cause the chamfered portion 54 to slide past the cantilever portion 46 and allow the binding insert 24 to move into a fully installed position, as illustrated in FIG. 7. When the binding insert 24 is moved from the partially installed position (FIG. 6) to the fully installed position (FIG. 7), the base 48 can pivot slightly relative to the tongue 50 (about the living hinge) to allow the binding insert 24 to flex enough for the chamfered portion 54 to clear the cantilever portion 46.

When the binding insert 24 is in the fully installed position, as illustrated in FIG. 7, the tongue 50 can be disposed substantially entirely in the pocket 44 and positioned beneath the cantilever portion 40 of the outer perimeter portion 32, and the cantilever portion 46 of the inner perimeter portion 34 can interface with the chamfered portion 54. The tongue 50 and the chamfered portion 54 can accordingly cooperate to facilitate retention of the binding insert 24 to the frame member 28. The protrusions 56 can extend above the frame member 28. Each of the binding inserts 24 can be installed on the frame 22 in a similar manner. During installation of the binding inserts 24, the binding inserts 24 that have already been installed can be slid within the elongated channel 38 to make room for additional ones of the binding inserts 24 until all of the binding inserts 24 have been successfully installed, as illustrated in FIG. 1.

Figure 8:
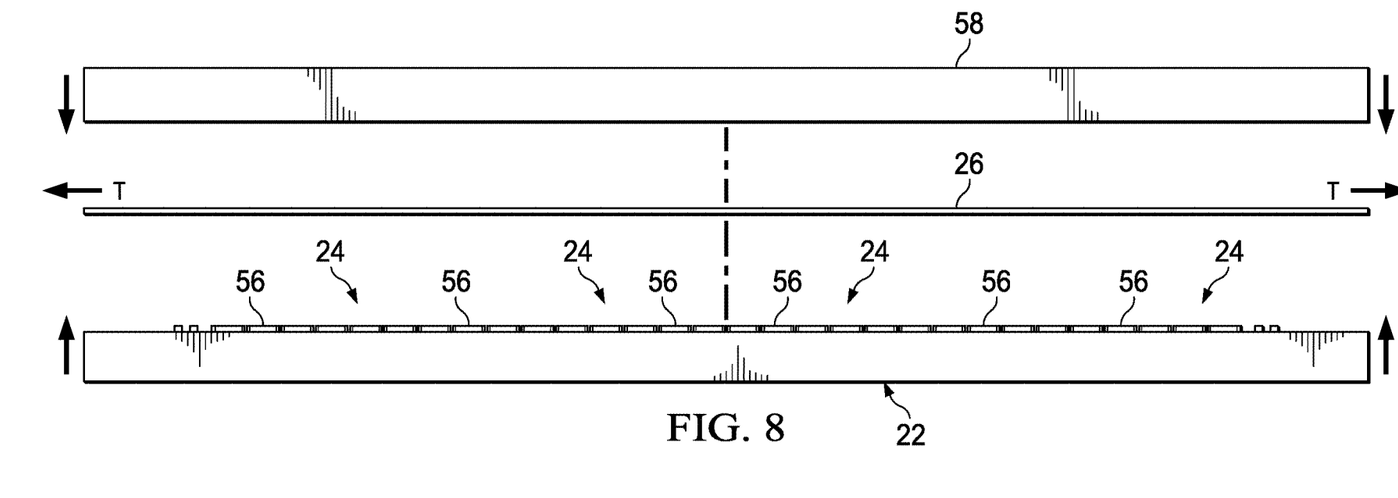
FIG. 8 is a schematic view depicting the frame assembly of FIG. 1 in association with a heat source.

Referring now to FIG. 8, once the binding inserts 24 have been installed on the frame 22, the frame 22 can be positioned beneath the mesh substrate 26. Outward tension (e.g., an applied tension) can be applied to the mesh substrate 26 (e.g., in the direction of arrows T) to effectively pull the mesh substrate 26 taught. The applied tension can be applied at various locations along the perimeter of the mesh substrate 26 in order to achieve a substantially uniform tension across the entire mesh substrate. In one embodiment, the mesh substrate 26 can be tensioned to between about 40 N and 45 N. Once the mesh substrate 26 is under the applied tension, the frame 22 can be raised into contact with the mesh substrate 26 such that the protrusions 56 contact the mesh substrate 26. A heat source 58 (e.g., a plurality of heated bars or a heated plate) can be heated and pressed onto the mesh substrate 26 to sandwich the mesh substrate 26 between the binding inserts 24 and the heat source 58. The heat source 58 can facilitate melting of the protrusions 56 into the mesh substrate 26. The heat source 58 can remain in contact with mesh substrate 26 long enough to melt the protrusions 56 without melting the rest of the binding inserts 24. Once the protrusions 56 are sufficiently melted, the heat source 58 can be removed from the frame 22 and the protrusions 56 can be allowed to cool. The applied tension on the mesh substrate 26 can then be released from the mesh substrate 26. Once the applied tension is released, a resulting tension can remain on the mesh substrate 26 which can be imparted to the binding inserts 24 to facilitate retention of the mesh substrate 26 to the frame 22. In particular, the resulting tension from the mesh substrate 26 can pull the binding inserts 24 towards the inner perimeter portion 34 of the frame members 28. The tongues (e.g., 50) of the binding inserts 24 can interface with the cantilever portions (e.g., 40) to prevent the binding inserts 24 from pulling out of the frame 22 while maintaining the resulting tension on the mesh substrate 26. In one embodiment, the resulting tension on the mesh substrate 26 can between about 75% and about 80% of the applied tension. The mesh substrate 26 can then be cut away from the perimeter of the frame 22 and a mask (not shown) can be formed on the mesh substrate 26 for use in an SMT process.

One example of a method for assembling and using the frame assembly 20, in accordance with the principles described above, will now be described. First, the frame 22 is assembled, and the binding inserts 24 are inserted into each of the frame members 28. The frame 22 is provided beneath the mesh substrate 26 and tension is applied along a perimeter of the mesh substrate 26 to stretch the mesh substrate 26 to an applied tension. The frame 22 is then raised into the mesh substrate 26 such that the protrusions 56 contact the mesh substrate 26. The heat source 58 is then heated and pressed into contact with the frame 22 to melt the protrusions 56 (and in some instances part of the base 48) into the mesh substrate 26 without melting the rest of the binding inserts 24. The heat source is then removed from the frame 22 to allow the binding inserts 24 to cool. Once the binding inserts 24 are sufficiently cooled, the applied tension is released from the mesh substrate 26 and is imparted to the binding inserts 24 to facilitate retention of the mesh substrate 26 to the frame 22 via the binding inserts 24. A mesh welded foil is then applied to the mesh substrate 26 and cut into a mask to complete the frame assembly 20. The frame assembly 20 is then used in an SMT process to create a printed circuit board. Once the SMT process is complete, the mesh substrate 26 can be partially cut away from the binding inserts 24 to remove the resulting tension from the binding inserts 24. The portion of the mesh substrate 26 that remains attached to the binding inserts 24 can be pulled away from the frame 22 to remove the binding inserts 24 from the frame 22 (in an opposite manner as described above with respect to FIGS. 5-7). The frame 22 can then be reused by installing new binding inserts (e.g., 24) and repeating the process described above. Reusing the frame 22 in this manner can provide a more effective, simple, and cost effective solution for recycling SMT stencils than conventional arrangements.

Figure 9:
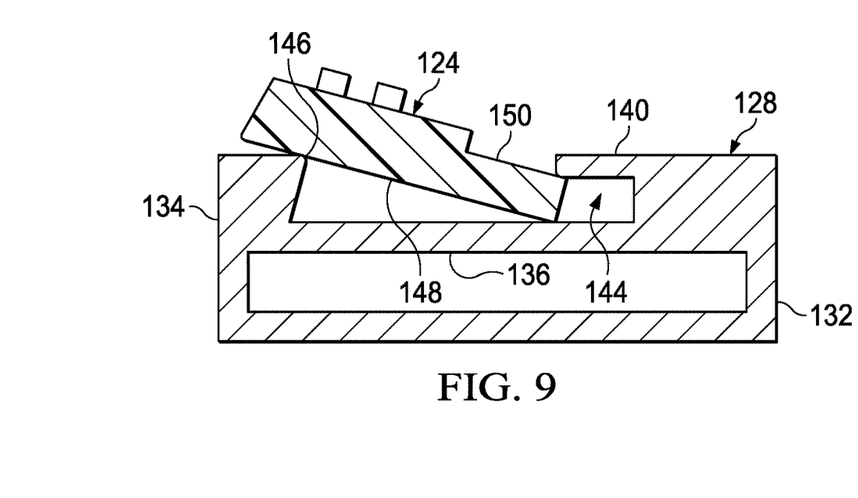
FIG. 9 is a cross-sectional view depicting a frame member and a binding member, in accordance with another embodiment.

FIG. 9 illustrates an alternative embodiment of a binding insert 124 and a frame member 128 that are similar to, or the same in many respects as, the binding insert 24 and the frame members 28 illustrated in FIGS. 1-7. For example, the binding insert 124 comprises a base 148 and a tongue 150 that extends from the base 148. The frame member 128 comprises an outer perimeter portion 132 and an inner perimeter portion 134 that define respective cantilever portions 140, 146. A subfloor 136 extends between the outer and inner perimeter portions 132, 134. The cantilever portion 140 cooperates with the subfloor 136 to define a pocket 144. However, the pocket 144 and the tongue 150 can be substantially flat (as opposed to being U-shaped).

Figure 10:
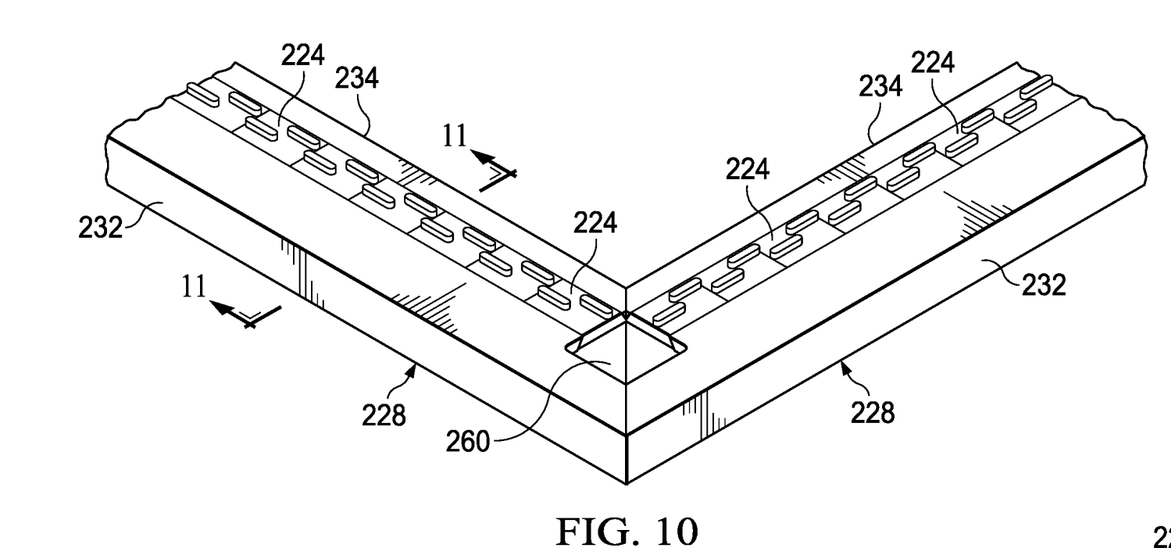
FIG. 10 is an isometric view depicting a pair of frame members and a plurality of binding members, in accordance with yet another embodiment.
Figure 11:
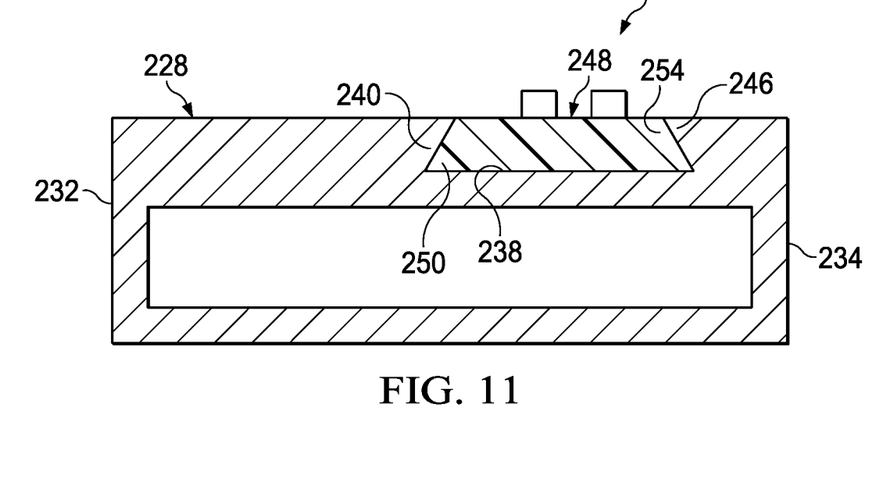
FIG. 11 is a cross-sectional view taken along the line 11-11 in FIG. 10.

FIGS. 10 and 11 illustrate another alternative embodiment of a plurality of binding inserts 224 and a pair of frame members 228 that are similar to, or the same in many respects as, the binding inserts 24 and the frame members 28 illustrated in FIGS. 1-7. For example, as illustrated in FIG. 11, each binding insert 224 of the plurality of binding inserts 224 comprises a base 248 and a tongue 250 that extends from the base 248. The base 248 comprises a chamfered portion 254. The frame member 228 comprises an outer perimeter portion 232 and an inner perimeter portion 234 that include respective cantilever portions 240, 246. However, the tongue 250 and the chamfered portion 254 of the binding insert can be substantially the same shape (e.g., wedge shaped). The cantilever portions 240, 246 can also be substantially the same shape. Each of the frame members 228 can define an elongated channel 238 and can cooperate to define a loading pocket 260 disposed at the end of elongated channels 238. Each of the binding inserts 224 can be inserted into one of the elongated channels 238 by introducing the binding insert 224 into the loading pocket 260 and sliding the binding insert 224 into the elongated channel 238.

Figure 12:
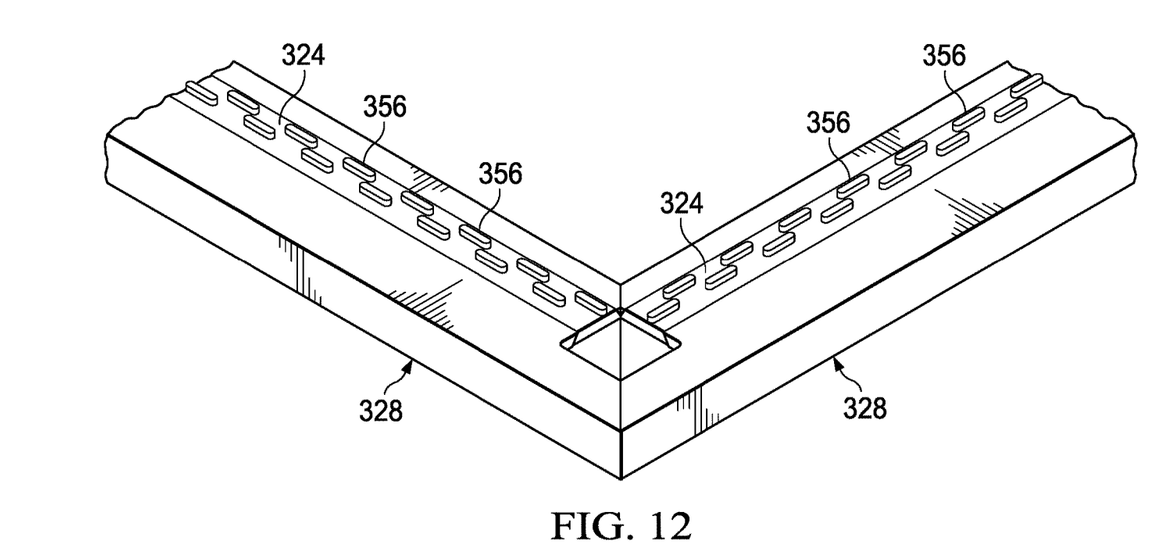
FIG. 12 is an isometric view depicting a pair of frame members and a plurality of binding members, in accordance with still yet another embodiment.

FIG. 12 illustrates yet another alternative embodiment of binding inserts 324 and a pair of frame members 328 that are similar to, or the same in many respects as, the binding inserts 224 and the frame members 228 illustrated in FIGS. 10 and 11. However, the binding inserts 324 can be longer than the binding inserts 224 illustrated in FIG. 10 and can include more protrusions 356.

Figure 13:
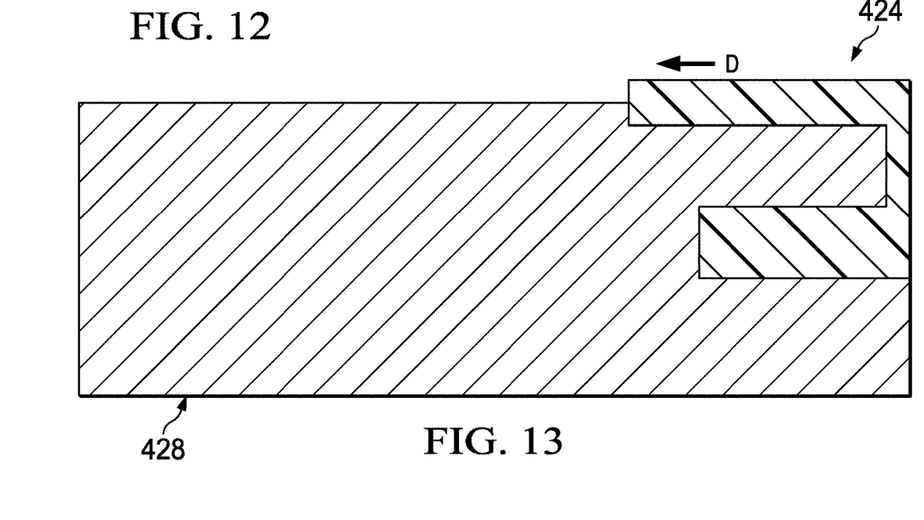
FIG. 13 is a cross-sectional view depicting a frame member, in accordance with still yet another embodiment.
Figure 14:
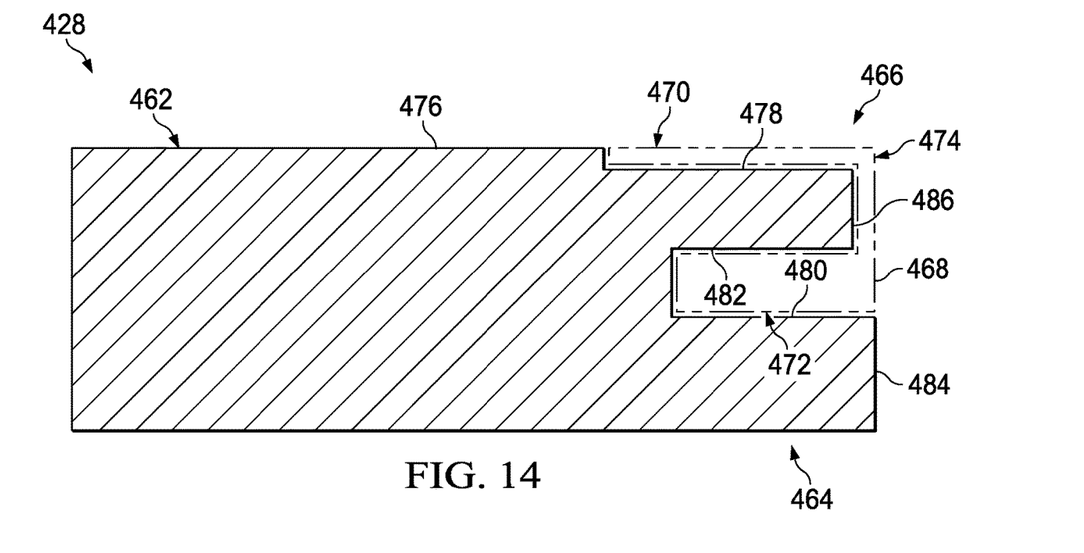
FIG. 14 is a cross-sectional view of the frame member of FIG. 13 in association with a binding insert.
Figure 15:
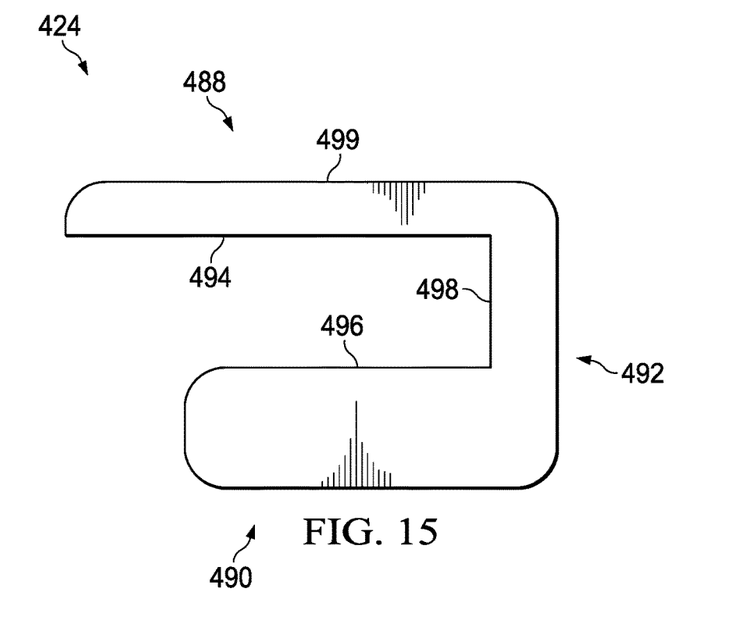
FIG. 15 is a cross-sectional view of the binding insert of FIG. 14.

FIGS. 13-15 illustrate yet another alternative embodiment of a binding insert 424 and a frame member 428 that are similar to, or the same in many respects as, the binding insert 24 and the frame members 28 illustrated in FIGS. 1-7. Referring now to FIG. 13, the frame member 428 and the binding insert 424 can be mated together to facilitate releasable coupling of the binding insert 424 to the frame member 428. As illustrated in FIG. 14, the frame member 428 can include a main portion 462, a lower portion 464, and a finger portion 466 that cooperate with each other to define a channel 468 (shown in dashed lines) that is substantially c-shaped (e.g., at a cross-section of the frame member 428) and extends along a perimeter of the frame member 428. The channel 468 can include an upper portion 470, a lower portion 472, and a central portion 474 that extends between the upper portion 470 and the lower portion 472. The main portion 462 can include a main upper surface 476 and the finger portion 466 can include a finger upper surface 478 that is vertically offset from the main upper surface 476 to at least partially define the upper portion 470 of the channel 468. The lower portion 464 and the finger portion 466 of the frame member 428 can be spaced from each other such that an upper surface 480 of the lower portion 464 and a lower finger surface 482 of the finger portion 466 cooperate to at least partially define the lower portion 472 of the channel 468. The lower portion 464 of the frame member 428 can include an outer surface 484 and the finger portion 466 can include an outer finger surface 486 that is horizontally offset from the outer surface 484 such that the finger portion 466 can at least partially define the central portion 474 of the channel 468.

Referring now to FIG. 15, the binding insert 424 can include an upper portion 488, a lower portion 490, and a central portion 492 that extends between the upper portion 488 and the lower portion 490. The upper portion 488, the lower portion 490, and the central portion 492 can be arranged to define a cross-sectional c-shape for the binding insert 424 that is substantially similar to the channel 468. The upper portion 488 can include a lower interior surface 494, the lower portion 490 can include an upper interior surface 496, and the central portion 492 can include a central interior surface 498 that extends between the lower and upper interior surfaces 494, 496. The upper portion 488 can include an upper exterior surface 499 which is configured to be fused (e.g., melted) to the mesh substrate 26.

Referring now to FIGS. 13-15, the binding insert 424 can be disposed in the channel 468 such that the upper, lower, and central portions 488, 490, 492 of the binding insert 424 (FIG. 15) are disposed in the upper, lower, and central portions 470, 472, 474 of the channel 468 (FIG. 14), respectively. A mesh substrate (e.g., 26 shown in FIG. 1) can be stretched with a stretching mechanism (not shown) and fused with the binding insert 424 thus providing tension to the upper portion 488 of the binding insert 424 in the direction D (FIG. 13). The lower and central portions 490, 492 of the binding insert 424 can interact with the lower and finger portions 464, 466 of the frame member 428 to retain the binding insert 424 in place when the mesh substrate is under tension. The cross-sectional c-shapes of the binding insert 424 and the channel 468 can accordingly cooperate to facilitate retention of the mesh substrate (not shown) with enough tension and without adhesive (e.g., epoxy) or other rigid or semi-rigid fastening arrangements to perform properly during a deposition process, while allowing the binding insert 424 and the mesh substrate to be easily removed after the deposition process.

Figure 16:
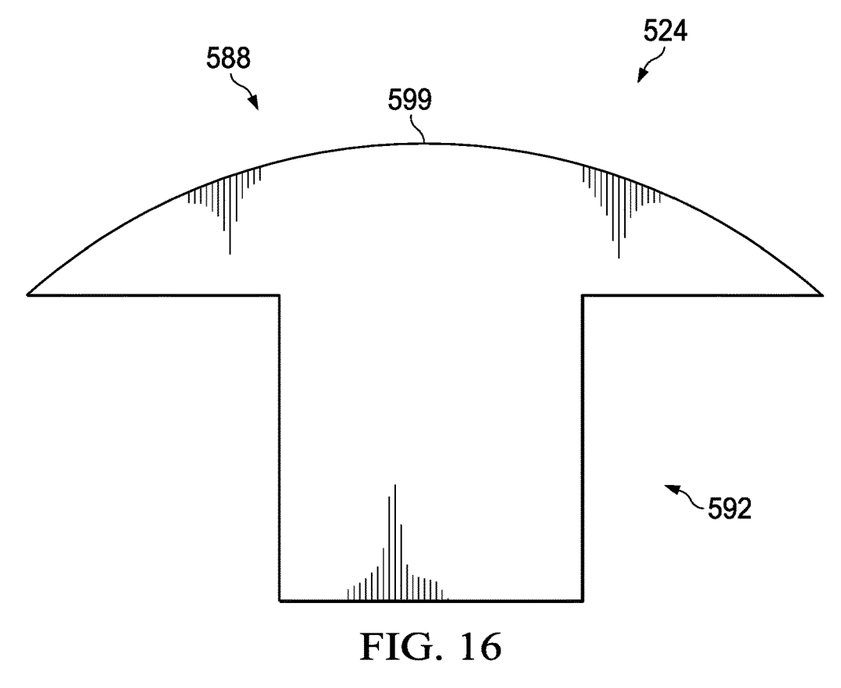
FIG. 16 is a cross-sectional view depicting a binding insert, in accordance with still yet another embodiment.

FIG. 16 illustrates yet another alternative embodiment of a binding insert 524 that is similar to, or the same in many respects as, the binding insert 424 illustrated in FIGS. 13 and 15. For example, the binding insert 524 can include an upper portion 588 and a central portion 592 that extends downwardly therefrom. The upper portion 588 can include an upper exterior surface 599 which is configured to be fused (e.g., melted) to a mesh substrate (e.g., 26). However, the upper portion 588 can have a substantially dome-shaped cross-section and the central portion 592 can have a substantially rectangular-shaped cross-section. The central portion 592 can extend downwardly from the upper portion 588 in a substantially perpendicular direction, such that the binding insert 524 has a rivet-shaped cross-section. The central portion 592 of the binding insert 524 can be configured to interface with a similarly shaped channel that is defined by a frame member (not shown) to selectively couple the binding insert 524 to the frame in a similar manner as described above with respect to the binding insert 24 and the frame member 28 of FIGS. 1-7.

Figure 17:
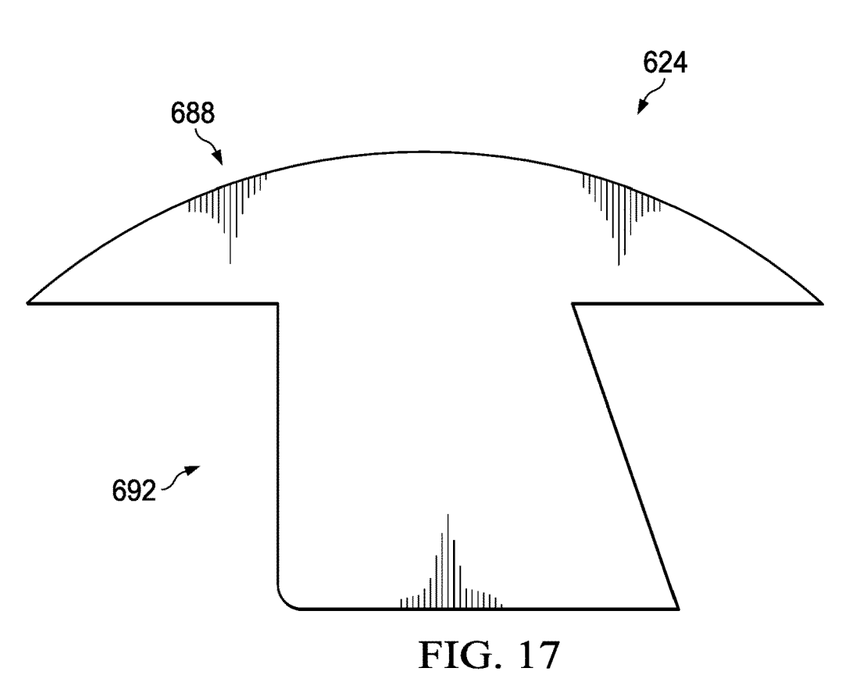
FIG. 17 is a cross-sectional view depicting a binding insert, in accordance with still yet another embodiment.

FIG. 17 illustrates an alternative embodiment of a binding insert 624 that is similar to, or the same in many respects as, the binding insert 624 illustrated in FIG. 16. For example, the binding insert 624 can include an upper portion 688 and a central portion 692. However, the central portion 692 can have a thickness that increases as it extends away from the upper portion 688.

Figure 18:
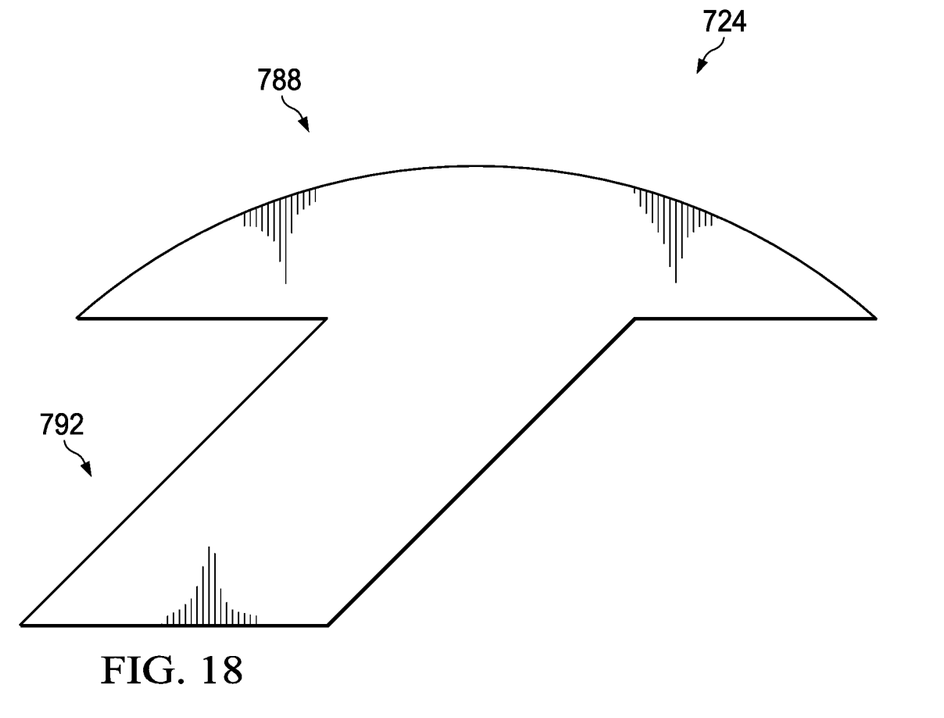
FIG. 18 is a cross-sectional view depicting a binding insert, in accordance with still yet another embodiment.

FIG. 18 illustrates an alternative embodiment of a binding insert 724 that is similar to, or the same in many respects as, the binding insert 524 illustrated in FIG. 16. For example, the binding insert 724 can include an upper portion 788 and a central portion 792. However, the central portion 792 can be angled with respect to the upper portion 788.

The foregoing description of embodiments and examples has been presented for purposes of illustration and description. It is not intended to be exhaustive or limiting to the forms described. Numerous modifications are possible in light of the above teachings. Some of those modifications have been discussed and others will be understood by those skilled in the art. The embodiments were chosen and described for illustration of various embodiments. The scope is, of course, not limited to the examples or embodiments set forth herein, but can be employed in any number of applications and equivalent devices by those of ordinary skill in the art. Rather, it is hereby intended that the scope be defined by the claims appended hereto. Also, for any methods claimed and/or described, regardless of whether the method is described in conjunction with a flow diagram, it should be understood that unless otherwise specified or required by context, any explicit or implicit ordering of steps performed in the execution of a method does not imply that those steps must be performed in the order presented and may be performed in a different order or in parallel.

What is claimed is:

1. A frame assembly for a framed stencil, the frame assembly comprising:
    a frame member comprising:
        an inner perimeter portion; and
        an outer perimeter portion that cooperates with the inner perimeter portion to define an elongated channel, the outer perimeter portion comprising a first cantilever portion that extends over the elongated channel and towards the inner perimeter portion; and
    a binding insert that is selectively insertable into the elongated channel, the binding insert comprising:
        a base formed at least partially of selectively meltable material that melts when heated and solidifies when cooled to facilitate coupling of a mesh substrate thereto; and
        a tongue coupled to the base and extending substantially horizontally from the base, wherein, when the binding insert is inserted into the elongated channel, the tongue extends beneath the first cantilever portion to facilitate retention of the binding insert to the frame member.

2. The frame assembly of claim 1 wherein:
    the inner perimeter portion comprises a second cantilever portion that extends over the elongated channel and towards the outer perimeter portion; and
    when the binding insert is inserted into the elongated channel, the second cantilever portion interfaces with the base to facilitate retention of the binding insert to the frame member.

3. The frame assembly of claim 2 wherein the base comprises a chamfered portion that interfaces with the second cantilever portion.

4. The frame assembly of claim 1 wherein the frame member is formed of a metal and the binding insert is formed of a thermoplastic.

5. The frame assembly of claim 1 wherein the first cantilever portion is curved downwardly and the tongue is curved upwardly.

6. The frame assembly of claim 1 wherein the tongue is coupled with the base via a living hinge.

7. The frame assembly of claim 1 wherein the binding insert further comprises a plurality of protrusions that extends substantially vertically from the base and is formed at least partially of selectively meltable material that melts when heated and solidifies when cooled to facilitate coupling of a mesh substrate thereto.

8. The frame assembly of claim 7 wherein, when the binding insert is inserted into the elongated channel, the plurality of protrusions extend above one or more of the outer perimeter portion and the inner perimeter portion.

9. A framed stencil comprising:
    a mesh substrate;
    a frame assembly comprising:
        an inner perimeter portion; and
        an outer perimeter portion that cooperates with the inner perimeter portion to define an elongated channel, the outer perimeter portion comprising a first cantilever portion that extends over the elongated channel and towards the inner perimeter portion; and
    a plurality of binding inserts, each binding insert of the plurality of binding inserts being selectively insertable into the elongated channel and comprising:
        a base formed at least partially of selectively meltable material that melts when heated and solidifies when cooled to facilitate coupling of the mesh substrate thereto; and
        a tongue extending substantially horizontally from the base wherein, when the plurality of binding inserts is inserted into the elongated channel, the tongue of each binding insert of the plurality of binding inserts extends beneath the first cantilever portion to facilitate retention of the plurality of binding inserts to the frame assembly.

10. The framed stencil of claim 9 wherein:
the inner perimeter portion comprises a second cantilever portion that extends over the elongated channel and towards the outer perimeter portion; and
each second cantilever portion interfaces with the base of each binding insert of the plurality of binding inserts to facilitate retention of the plurality of binding inserts to the frame assembly.

11. The framed stencil of claim 10 wherein the base of each binding insert of the plurality of binding inserts comprises a chamfered portion that interfaces with the second cantilever portion of the frame assembly.

12. The framed stencil of claim 9 wherein:
the first cantilever portion of the frame assembly is curved downwardly; and
the tongue of each binding insert of the plurality of binding inserts is curved upwardly.

13. The framed stencil of claim 9 wherein, for each binding insert of the plurality of binding inserts, the tongue is coupled with the base via a living hinge.

14. The framed stencil of claim 9 wherein each binding insert of the plurality of binding inserts further comprises a plurality of protrusions that extends substantially vertically from the base and is formed at least partially of selectively meltable material that melts when heated and solidifies when cooled to facilitate coupling of the mesh substrate thereto.

15. The framed stencil of claim 14 wherein, when the plurality of binding inserts is inserted into the elongated channels, the plurality of protrusions extends above one or more of the outer perimeter portion and the inner perimeter portion of the frame assembly.

16. The framed stencil of claim 9 wherein the frame assembly is substantially rectangular shaped.

* * * * *